US005409568A

United States Patent [19]

Vasché

[11] Patent Number: 5,409,568

[45] Date of Patent: Apr. 25, 1995

[54] METHOD OF FABRICATING A MICROELECTRONIC VACUUM TRIODE STRUCTURE

[76] Inventor: Gregory S. Vasché, 100 Worcester Loop, Los Gatos, Calif. 95032

[21] Appl. No.: 924,814

[22] Filed: Aug. 4, 1992

[51] Int. Cl.[6] ........................ H01L 21/306; B44C 1/22; C03C 15/00; C03C 25/06

[52] U.S. Cl. .................................. 156/657; 156/659.1; 156/662; 156/653; 437/191; 437/228

[58] Field of Search ............... 156/643, 644, 653, 656, 156/657, 659.1, 662; 437/191, 192, 193, 195, 196, 200, 233, 228, 239, 240, 247; 357/65, 67, 71

[56] References Cited

U.S. PATENT DOCUMENTS

| | | | |
|---|---|---|---|
| 3,789,471 | 2/1974 | Spindt et al. | 29/25.17 |
| 4,307,507 | 12/1981 | Gray et al. | 29/25.14 X |
| 4,721,885 | 1/1988 | Brodie | 313/576 |
| 4,827,177 | 5/1989 | Lee et al. | 313/306 |
| 5,023,694 | 6/1991 | Yeh | 357/54 |

OTHER PUBLICATIONS

R. B. Marcus and T. T. Sheng, (1983) *Transmission Electronic Microscopy of Silicon VLSI Circuits and Structures,* pp. 48–58.

Ivor Brodie, (1989) *IEEE Transactions On Electron Devices,* 36(11):2641–2644, "Physical Considerations in Vacuum Microelectronics Devices."

Robert B. Marcus, et al., (1990) *IEEE Transactions On Electronic Devices,* 37(6):1545–1550, "Simulation and Design of Field Emitters."

Takao Utsumi, (1991) *IEEE Transactions On Electronic Devices, 38(10):2276–2283, "Keynote Address, Vacuum Microelectronics: What's New and Exciting."*

R. B. Marcus, et al, (1991) *IEEE Transactions On Electronic Devices,* 38(10):2289–2293, "Atomically Sharp Silicon and Metal Field Emitters."

Steven M. Zimmerman and Wayne T. Babie, (1991) *IEEE Transactions On Electronic Devices,* 38(10):2294–2303, "A Fabrication Method for the Integration of Vacuum Microelectronic Devices."

C. A. Spindt, et al., (1991) *IEEE Transactions On Electronic Devices,* 38(10):2355–2363, "Field–Emitter Arrays for Vacuum Microelectronics."

C. E. Holland, et al., (1991) *IEEE Transactions On Electronic Devices,* 38(10):2368–2372, "A Study of Field Emission Microtriodes."

Rosemary A. Lee, et al., (1989) *IEEE Transactions On Electronic Devices,* 36(11):2703–2708, "Semiconductor Fabrication Technology Applied to Micrometer Valves."

William J. Orvis, et al., (1989) *IEEE Transactions On Electronic Devices,* 36(11):2651–2657, "Modeling and Fabricating Micro–Cavity Integrated Vacuum Tubes."

*Primary Examiner*—William A. Powell
*Attorney, Agent, or Firm*—Townsend and Townsend Khourie and Crew

[57] ABSTRACT

An improved vacuum microelectronic device comprised of a first polysilicon layer-having hornlike protrusions forming the emitter of the device, a first insulating layer separating the first polysilicon layer from a second polysilicon layer forming the grid of the device; a second insulating layer separating the second and third polysilicon layers. A portion of the first insulating layer, the second polysilicon layer, and second insulating layers are removed to form a grid aperture region positioned directly above the hornlike protrusion of the emitter. A cavity exists between the grid aperture region and a third polysilicon layer. The cavity is evacuated to form the vacuum region of the device.

13 Claims, 5 Drawing Sheets

METHOD OF FABRICATING A MICROELECTRONIC VACUUM TRIODE STRUCTURE

BACKGROUND OF THE INVENTION

This invention relates to the field of vacuum microelectronic devices and their manufacture. In particular, in one embodiment the present invention provides an improved method and structure for a vacuum microtriode device using standard semiconductor fabrication techniques.

Vacuum tube and integrated circuit devices and their fabrication have been well known for many years. Recently, techniques originally used for fabrication of integrated circuit devices have been applied to make miniaturized vacuum tube devices. This new technology is referred to as "vacuum microelectronics." Vacuum microelectronic devices offer several advantages over traditional integrated circuit devices. Since a vacuum is an ideal electron transport medium, electrons travel at a higher speed increasing the device switching speed. Also, since there is no scattering medium to impede electron transport, there is no heat produced as in traditional integrated circuits. An additional advantage of vacuum microelectronic devices is their relative temperature and radiation insensitivity compared to traditional integrated circuit devices. Also, since no active junction regions exist, there is no associated parasitic capacitance and the semiconductor medium used for processing vacuum microelectronic devices does not need to be as of high a quality as used in traditional integrated circuit devices, decreasing manufacturing costs.

Although several types of vacuum microelectronic device structures and processing methods have been proposed, no proposed method or structure has resulted in a high density, easy to manufacture structure. As of this date vacuum microelectronic devices are not generally commercially available.

In particular, processes currently being utilized to produce vacuum microelectronic devices have been plagued by process control problems. For example, the process described in the article "Development Toward The Fabrication of Vacuum Microelectronic Devices Using Conventional Semiconductor Processing" by Zimmerman et al. describes an inverted wedge emitter structure fabricated from a cusping mold. The emitter structure is produced by depositing silicon dioxide of precise thickness into an etched cavity of particular dimensions. Cusp formation is dependent on the thickness of the deposited silicon dioxide and the aperture depth and width. Because a small change in the aperture depth and width results in a large change in thickness of the silicon dioxide layer at the cusp apex, controlling the cusp formation and characteristics of the cusp is difficult. The aforementioned paper reported processing problems and did not report fully functional results at the time of publication.

The paper "Field-Emitter Arrays for Vacuum Microelectronics" by C. A. Spindt et al., and U.S. Pat. No. 4,721,885, "Very High Speed Integrated Microelectronic Tubes," to Brodie both describe field-emitter arrays with molybdenum cones as emitters and molybdenum gates. The molybdenum cones and gates are formed by sputtering molybdenum on a substrate. Although these references report functional devices, the devices are operational only at relatively high voltages (>20 volts). The devices described in the Spindt article and the Brodie patent do not readily lend themselves to the low voltage operation used in current VSLI or ULSI devices. High voltage potential in the prior devices is required due to the relatively large emitter tip radius' (200 Å–500 Å) produced by currently reported microelectronic triode devices. In addition, these devices do not lend themselves to large scale integration of components as is common in planar semiconductor technology.

A microtriode device having a reduced emitter tip radius which is easy to manufacture is needed to produce vacuum microelectronic devices operable at voltages below 10 V.

SUMMARY OF THE INVENTION

An improved vacuum microelectronic device is disclosed. The invention provides devices which have improved performance, reduced size, and/or which may be fabricated more simply. The device has a triode structure which includes an emitter, a grid and an anode. The device is comprised of a first polysilicon layer having hornlike protrusions forming the emitter of the device, a first insulating layer separating the first polysilicon layer from a second polysilicon layer that forms the grid of the device; a second insulating layer separating the second and third polysilicon layers. A portion of the first insulating layer, the second polysilicon layer, and second insulating layers are removed to form a grid aperture region positioned directly above the hornlike protrusion of the emitter. A cavity exists between the grid aperture region and a third polysilicon layer. The cavity is evacuated to form the vacuum region of the device.

According to one aspect of the invention, an improved method of emitter formation is disclosed. The emitter structure is formed from a patterned layer of doped polysilicon or refractory metal silicide. The emitter is formed by oxidizing either or both edges of the patterned polysilicon line. Since silicon oxidizes more slowly on external corners than on flat edges, a polysilicon edge during oxidation will transform into a "hornlike" projection having a tip radius on the order of approximately 50 Å. This method of emitter formation has several advantages over previous processes.

First, the emitter tip radius is primarily dependent upon the oxide growth, a parameter which is a easily controllable. Oxide growth may be easily changed in a controlled manner by varying the ambient, time and temperature in a diffusion furnace. In addition, the tip radius of the emitter (approximately 50 Å) is smaller than structures formed by metal sputtering or thin film deposition techniques. The smaller tip radius enables device operation voltages to be reduced to below 10 V. Another advantage of the aforementioned method is that the horn-like protrusions may be formed on both edges of the pattern polysilicon region producing a dual emitter structure. Such a structure decreases the spacing requirements of the device, doubles the emission density and increases the packing density of the vacuum microelectronic devices.

According to another aspect of the invention, an improved method of control grid formation is disclosed. The control grid is formed by deposition of a second, relatively thin layer of polysilicon which like the first polysilicon layer, can be patterned and silicided in conjunction with the refractory metal. This patterned layer may also extend away from the device region to form an interconnect layer. Apertures are formed in the control grid by a thin photoresist breakage process. The photoresist breakage process dispenses a low viscosity resist on the substrate and spins the resist to a thickness of a few thousand angstroms. The thin resist breaks over the steep exposed topological edges of the second insulating layer. The resultant width of the resist break (and ultimately the width of the grid aperture) is controlled by the resist thickness. In turn the resist thickness is controlled by the viscosity of the resist, the spin speed, time of spin and the etchback process.

According to another aspect of the invention, an improved method of anode formation is disclosed. The plate or anode, is formed by patterning a third layer of doped polysilicon directly over the grid aperture and emitter regions of the device. A layer of a sacrificial oxide is deposited, patterned and selectively etched away from the emitter-anode region by a controlled undercutting etch. The controlled etch forms a void region between the emitter (first polysilicon layer) and anode (third polysilicon layer).

An overall method of forming a triode vacuum microelectronic device is also provided. The method includes the steps of forming an oxide layer over the doped silicon substrate; implanting and annealing dopants into a first deposited polysilicon layer; masking and etching the first polysilicon layer to form an emitter region; oxidizing the polysilicon to form a horn-like protrusion on the emitter edge; implanting and annealing a dopant into a second polysilicon layer; etching the second polysilicon layer; oxidizing the second polysilicon layer; applying, soft-baking and developing back a thin resist; masking and etching a grid aperture; depositing a sacrificial oxide; masking and etching a cavity region; depositing, masking, and etching a third polysilicon region to form an anode; annealing dopants into a third polysilicon layer structure; depositing a phosphosilicate glass to enclose the triode structure.

A further understanding of the nature and advantage of the inventions herein may be realized by reference to the remaining portions of the specification and the attached drawings.

DETAILED DESCRIPTION OF THE PREFERRED EMBODIMENT

Figure 1:
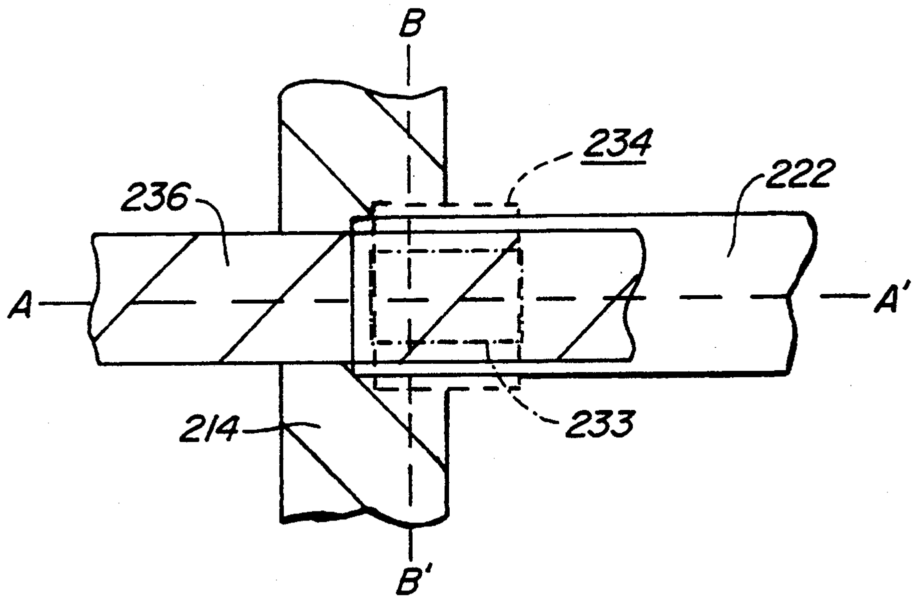
FIG. 1 is a layout of a vacuum microelectronic device having a triode structure according to the present invention.

FIG. 1 is a layout of a vacuum microelectronic device having a triode structure according to the present invention. The layout shows a first polysilicon layer 214 forming the emitter of the device, a second polysilicon layer 222 forming the control grid of the device, and a third polysilicon layer 236 forming the device anode. An opening 233 is a grid aperture in the control grid. While a single device is illustrated, it will be apparent that many such devices will be fabricated in a substrate.

The device operates by applying potential between the anode and the cathode so that the electric field points toward the cathode (anode positive with respect to the cathode). By virtue of the geometric rounding of the cathode, the electric field lines tend to converge at the cathode tip. Typically the field at the cathode surface reaches values exceeding $5\times10^7$ volts/cm. At this electric field value, electrons tunnel out of the emitter surface towards the underside of the anode according to the Fowler-Nordheim relationship $$J=AE^2\exp\text{-}B(\phi)^{3/2}/E)$$

where J is the emission current density, E is the electric field, ($\phi$) is the emitter work function, and A and B are constants. A secondary field which directly influences the net field, is produced by a separate potential applied to the grid. This potential influences the cathode-anode current enabling a modulation of the flow of electrons between the cathode and anode. In this way the device can function as an amplifier or a switch. Because of the vacuum media, the transit time for an electron is at least an order of magnitude smaller than that of a solid state device having similar dimensions.

FIGS. 2A–L illustrates the fabrication steps of a vacuum microelectronic device having a triode structure. The vacuum microelectronic devices are fabricated on a silicon substrate 210. The substrate is typically an n-type substrate having a dopant concentration in the general range of $10^{20}$ /cm$^3$ in one particular embodiment.

Figure 2A:
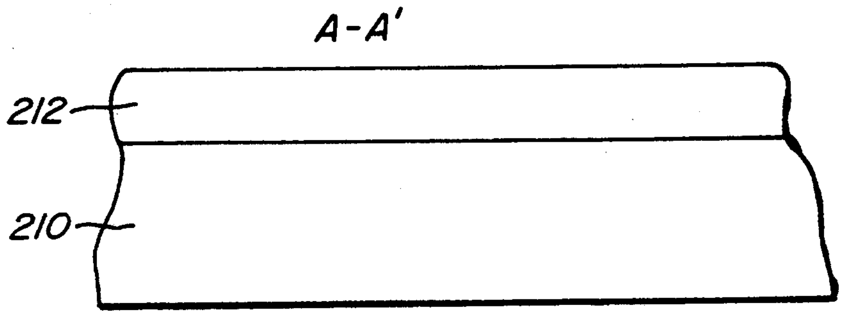
FIGS. 2(A–O) illustrates the fabrication of a vacuum microelectronic device having a triode structure, the fabrication steps shown are a cross-sectional view along the A—A cross-section of the layout of FIG. 1.

FIG. 2A is a cross-section after a thick oxide is formed on the silicon substrate 210. A thick oxide layer 212 provides electrical isolation between adjacent vacuum microelectronics devices. The oxide layer 212 is deposited or grown by conventional fabrication techniques. The oxide thickness is typically in the range of 10,000–20,000 Å. A ground contact (not shown) may be patterned and etched according to standard photolithographic techniques after oxide layer 212 formation.

Figure 2B:
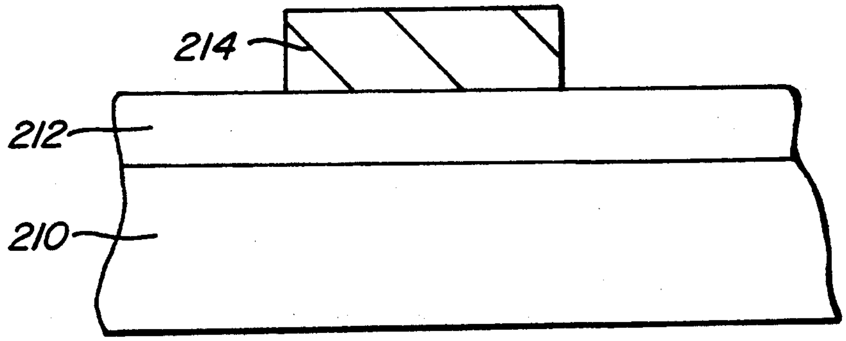

FIG. 2B illustrates the device cross-section after formation of a patterned polycrystalline silicon layer 214. The layer of polycrystalline silicon 214, henceforth called polysilicon, shown in FIG. 2B is deposited over the thick substrate oxide 212 using conventional low pressure chemical vapor deposition, henceforth called LPCVD. The thickness of the first polysilicon layer is approximately 5,000 Å in one embodiment.

After polysilicon deposition, the first polysilicon layer 212 is doped with an n type impurity to an impurity concentration of approximately $10^{15}$ /cm$^2$ in one preferred embodiment. The dopant concentration is accomplished typically either by ion implantation or by employing a standard furnace predeposition process. To evenly distribute the impurity concentration in the polysilicon layer to facilitate uniform etching of the polysilicon layer, a furnace anneal in a 5% oxygen/nitrogen or argon ambient is carried out at 1,000° C. for approximately 30 minutes. The resultant polysilicon resistivity has a resistivity in the range of 100 to 500 ohms per square. The polysilicon layer 214 is then patterned and etched using conventional photolithographic techniques to form the structure shown in FIG. 2B.

According to one embodiment, silicide is formed on the doped first polysilicon layer 214. Silicide is formed by depositing a suitable refractory metal such as tantalum, tungsten, or titanium to a thickness of approximately 1,000 Å. The refractory metal is typically deposited by sputtering or LPCVD deposition. After deposition of the refractory metal, a furnace anneal occurs. Adequate silicidation of the polysilicon is accomplished by extending the furnace anneal time from approximately 30 minutes to approximately 60 minutes. Silicide formation is desirable since it lowers the interconnect resistance and improves device performance. With decreased interconnect resistance, device switching time is decreased and the upper limit of emitter injected current is increased since the refractory metal tends to concentrate in the emitter tip region after oxidation. After silicide formation, unreacted refractory metal is removed from the oxide.

Following the patterning, etch, and resist removal steps to form a the polysilicon layer 214 shown in FIG. 2B, an oxidation step occurs. The polysilicon layer 214 is subjected to a wet or dry oxidizing ambient typically between the temperatures of 800°-1,000° C. after full silicidation is complete. This oxidation process typically grows a thermal oxide layer 216 having a thickness of between 500–1,000 Å. The oxidation step shown in FIG. 2C achieves two purposes. First, the oxidation layer 216 provides electrical isolation for the first polysilicon layer 214. Second, the oxidation step results in the formation of the emitter "horns" on the upper edges of the polysilicon layer 214. By "horns" it is intended to mean a structure such as described on pages 48–58 of the book "Transmission Electron Microscopy of Silicon VLSI Circuits and Structures" by R. B. Marcus and T. T. Sheng. The "horn" structure include a base. The horn structure decreases in radius until terminating at a tip. The decrease in radius occurs along an axis through the tip of the structure.

Figure 2C:
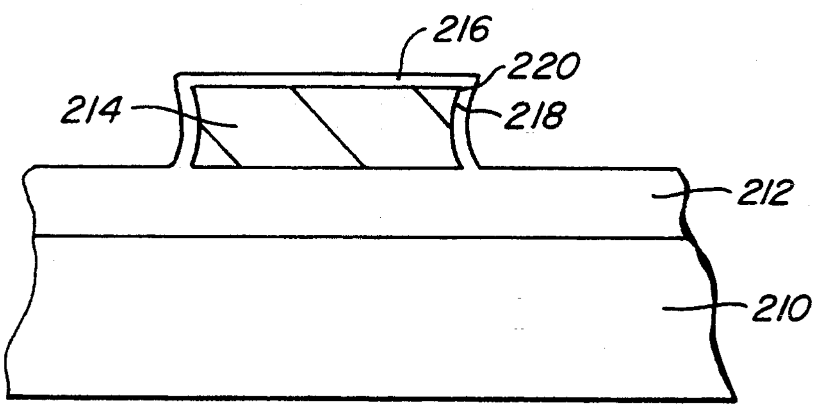

FIG. 2C is a cross-section of the invention after emitter formation. It is well known that the oxidation rate of silicon at external or internal corners is lower than the oxidation rate over a planar silicon surface. For oxidation of polysilicon having a light to moderate dopant concentration, the oxidation rate is lower on the corner regions than on the immediately adjacent sides. Thus as oxidation progresses, more silicon is consumed on the sides 218 of the polysilicon region 214 then on the corners 220. Using a transmission electron microscope, these horn formations or protrusions have been measured to have a tip radii of approximately 50 Å. This is at least an order of magnitude smaller than other reported emitter tip radii in other currently reported microelectronic vacuum devices using sputtering as a means of emitter formation.

An optional dipback and second oxide edge formation step may follow the first edge oxidation step shown in FIG. 2C. The dipback etch typically applies a 10:1 hydrofluoric (HF) acid solution to the structure shown in FIG. 2C, etching away approximately 250 Å–500 Å of oxide, preferably about 500 Å. The dipback step is followed by a second edge oxidation step. The oxide layer is subjected to a wet or dry oxidizing ambient typically between 900°-1,000° C. The second edge oxidation step typically resets the thickness of the oxide layer 216 back to 500 Å–1000 Å. The additional dipback and second edge oxidation step result in sharper horn formations to decrease the emitter tip radii.

Figure 2F:
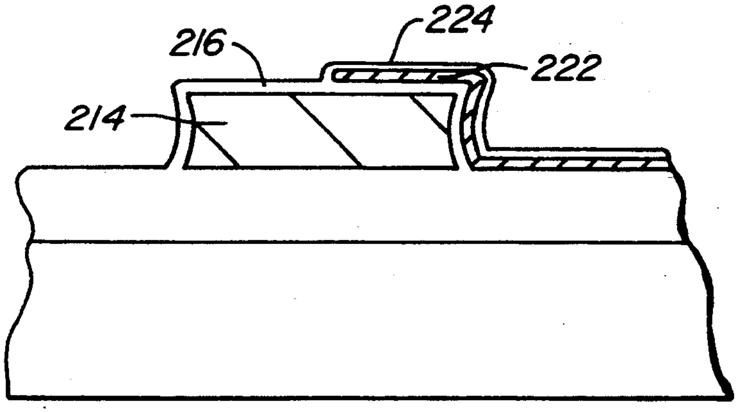
Figure 2D:
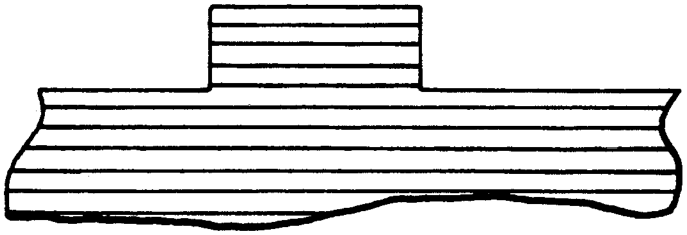
Figure 2E:
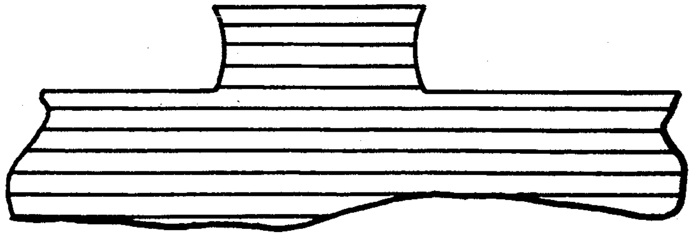

FIGS. 2D and 2E show an alternate embodiment for formation of the horn regions of the emitter. Instead of forming the horn regions from an etched polysilicon region 214, the horn regions of the emitter are formed from an etched region of a silicon substrate 219. FIG. 2D shows the silicon substrate 219 after a mask, etch and resist removal step. The silicon substrate 219 may be doped before or after the aforementioned steps to improve the conductivity of the silicon substrate. After masking the silicon substrate, an etch is performed into the silicon substrate, leaving the structure shown in FIG. 2E. After removal of the silicon substrate an oxidation step follows. As previously discussed with respect to the polysilicon structure shown in FIGS. 2B and 2C, the oxidation step will form horn-like structures on the corners 221 of the silicon substrate 219 since the oxidation rate is lower on the corner regions than the immediately adjacent sides.

FIG. 2F is a cross-section of the invention after formation and oxidation of a second polysilicon layer 222. The second polysilicon layer 222 is fabricated using standard polysilicon deposition techniques. After formation of the polysilicon emitter is completed, the second layer of polysilicon 222 is formed on top of the oxide layer 216 as can be seen in FIG. 2F. The thickness of the second polysilicon layer 222 is thinner than the first polysilicon layer 214, typically in the range of 1,000–3,000 Å, preferably about 1,500 Å. The second polysilicon layer 222 functions as the control grid of the device in addition, the second polysilicon layer 222 may also be used to interconnect different devices on the substrate.

The second polysilicon layer 222 or grid polysilicon is subsequently doped with an n-type impurity such as arsenic or phosphorous to a dopant concentration of about $1\times10^{20}$ to $5\times10^{20}$, preferably about $5\times10^{20}$. The doping of the n-type concentration may be accomplished either in a diffusion furnace or by ion implantation. To evenly distribute the impurity concentration in polysilicon layer 222, a furnace anneal in a 5% oxygen/-nitrogen or argon ambient is performed. A low polysilicon sheet resistance between 30–150 ohms is typical. Also in a process similar to formation of the first polysilicon layer, a silicide may be formed on the second polysilicon layer.

Following the patterning etch and resist removal steps, oxidation of the second polysilicon layer 222 occurs. During oxidation, an oxide layer having a thickness of between 500 –1,000 Å, preferably 1,000 Å is grown over the second polysilicon layer 222. Typically the oxidation of the second polysilicon layer 222 occurs in a standard oxidation furnace at a temperature of 1,000° C. in a wet or dry $O_2$ ambient. The thermal oxide layer 224 surrounds the second polysilicon layer 222 and electrically isolates the second polysilicon layer 222 from contact with adjacent conductive layers.

Figure 2G:
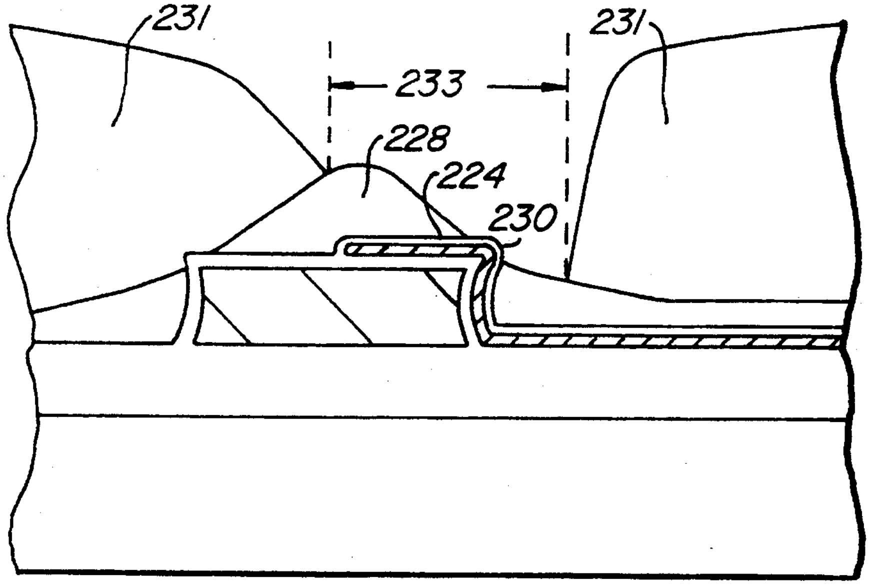
Figure 2H:
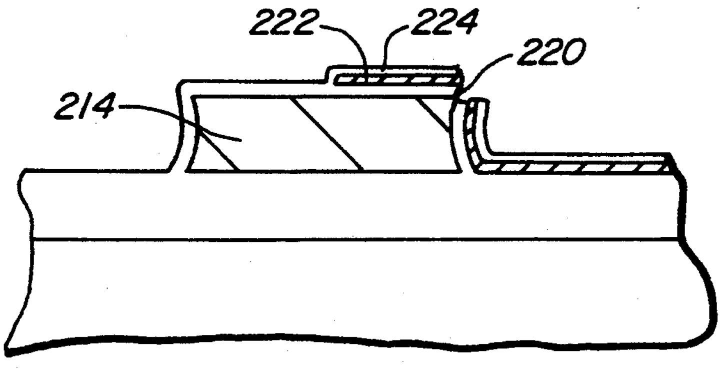

After formation of the second oxide layer 224, an aperture 226 is formed in the oxide layer 224, the second polysilicon layer 222 and the first oxide layer 216 in order to expose the hornlike emitter tip 220 at the corner of the first polysilicon layer 214. The steps showing grid aperture formation are seen in FIGS. 2G and 2H. The first step in grid aperture formation is the deposit of a very thin layer of a low viscosity positive photoresist 228. The photoresist 228 is dispensed and spun to a thickness of approximately 3,000 Å. Because of the height and sharpness of the profile at the exposed corner 230 of the oxide layer 224, the resist thickness is much thinner at the exposed corner 230 typically between 0–1,000 Å. A standard "soft" bake procedure follows the thin resist deposition in order to stabilize the resist layer.

After the thin resist deposition and soft bake steps, a controlled etchback of the thin film resist layer 228 is performed to facilitate the complete removal of the resist 228 at the corners 230. The etchback time, developer temperature, and chemical concentrations are carefully controlled during this procedure to remove a limited amount of photoresist. The amount of resist removal at the exposed corner 230 determines the size of the polysilicon grid aperture width.

After the thin resist layer 228 is thinned sufficiently to open at the oxide corner regions 230, a standard hard bake procedure follows to further stabilize the resist layer 228. After the hard bake process an additional layer of positive photoresist 231 is deposited directly over the thin resist layer 228. The additional photoresist layer 231 has a standard thickness and is exposed to a grid aperture mask 233 according to standard photolithographic techniques. The photo mask 233 opens the active areas of the triode device structure. All other areas of the structure are protected by the photoresist layer 231.

After the photoresist deposition steps shown in FIG. 2G, a grid etch occurs. The device structure illustrated in FIG. 2H shows the device after the grid etch process. FIG. 2I shows a perspective view of the device after the grid etch. The grid etch step may be accomplished using either wet chemical or dry plasma processing techniques. First, the second oxide layer 224 is etched away using a dilute acid such as 10:1 hydrofluoric acid (HF), until the second polysilicon layer 222 is exposed. The acid is allowed to continue to etch for an additional preset time in order to undercut the overlying resist and determine the aperture width 232 as seen in FIG. 2J. Typical total etch times in 10:1 HF will be between 30 seconds to 5 minutes depending on the oxide thickness and the amount of undercut required. FIG. 2J shows an enlarged view of the grid aperture as seen in FIG. 2H. In the embodiment shown in FIG. 2J, the grid aperture 232 is self aligned with the emitter corner 220.

After etching of the oxide layer 224, the second polysilicon layer 222 is etched in a polysilicon etchant such as potassium hydroxide (KOH) which has a high selectivity against thermal oxide. This is important so that the underlying oxide layer 216 on the emitter tip is not penetrated and the tip subsequently destroyed. The second layer of polysilicon 222 is etched until the underlying first oxide layer 216 is exposed. A final etch procedure, typically using dilute hydrofluoric acid, removes the first oxide layer until at least reaching the first polysilicon layer 214. This etch is controlled using standard procedures to expose a certain preset amount of the polysilicon one emitter tip 220. In 10:1 HF, the etch time is between 30 seconds and 2 minutes. Typically, after each wet etch process described above, the substrates are rinsed in deionized water to allow the subsequent etch processes to proceed without contamination from the previous etch process. The three aforementioned etch processes can also be accomplished using any combination of wet chemical or dry plasma processing techniques.

Since the areas which are not part of the grid aperture are protected by the photoresist layer 231, the grid etch procedure can be initiated. It should be noted here that FIG. 2G and 2H show only one corner 230 exposed to form a single emitter device structure. The processing steps can be easily changed to accommodate a dual emitter structure where both corners of the first polysilicon layer 214 form active regions of the structure. FIG. 2K is a cross-sectional view of a dual emitter microtriode device. This approach has the advantage of increasing the density of the vacuum microelectronic devices and at this time is seen as being the preferred embodiment of the invention.

Figure 2L:
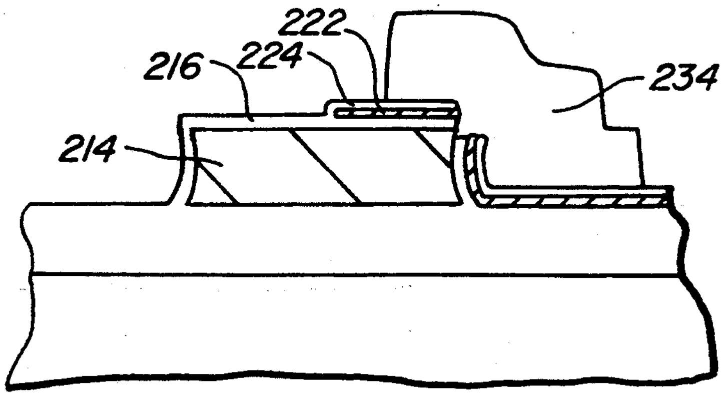
Figure 2I:
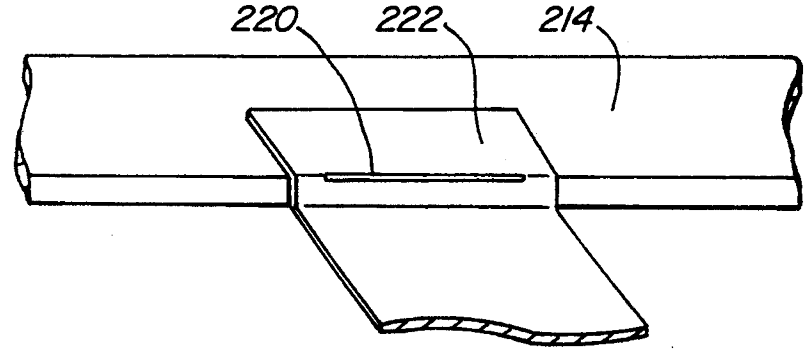
Figure 2K:
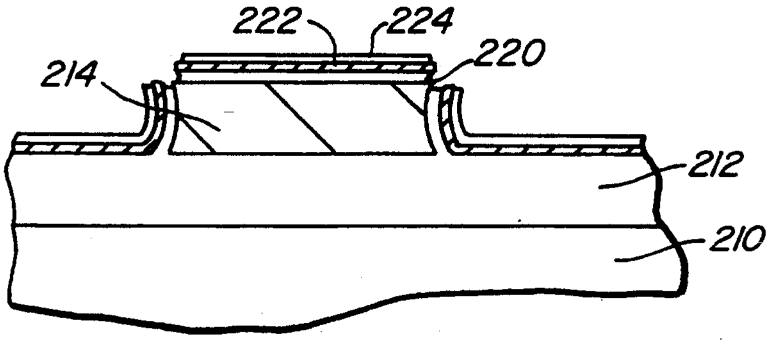
Figure 2J:
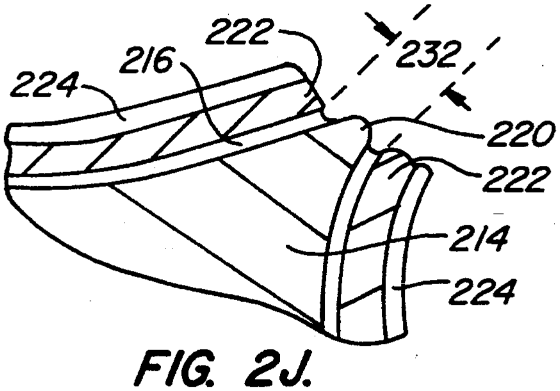
Figure 2M:
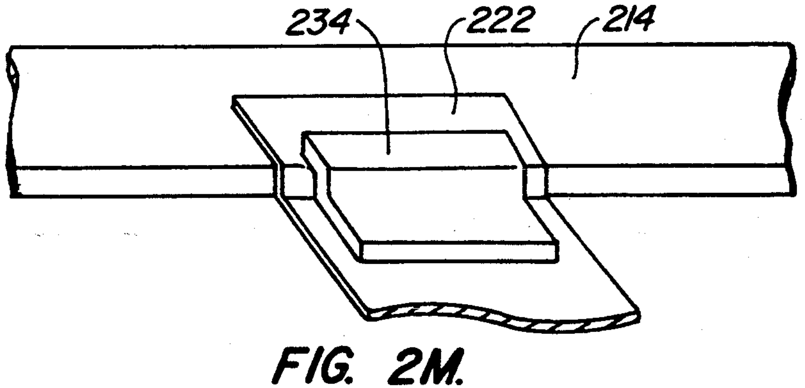

After the grid aperture formation shown in FIGS. 2G–2I, a sacrificial oxide layer 234 as shown in FIG. 2L is deposited. FIG. 2L is a cross-sectional view of the device after deposition of the sacrificial oxide. FIG. 2M is a perspective view of the device after deposition of the sacrificial oxide. The sacrificial oxide may be deposited using either APCVD or LPCVD methods to a thickness of between 500 -10,000 Å. The thickness of the sacrificial oxide layer 234 determines the spacing between the emitter and cathode and anode. In order to achieve certain etch rates, and conformality of deposition, the sacrificial oxide 234 may be doped with an n type dopant such as phosphorous or boron to a level between 0 and 8% by weight. After formation of oxide layer 234, the oxide layer is patterned according to standard photolithography techniques to form the structure as shown in FIG. 1 and 2L.

After the masking and etching of the sacrificial oxide layer 234, a third polysilicon layer 236 (shown in FIG. 2N) is deposited. The polysilicon layer 236 is typically deposited using LPCVD to form a layer having a thickness of approximately 5,000 Å. This polysilicon layer 236 forms the anode structure of the microtriode device and corresponding interconnect. The polysilicon anode 236 is self aligned with the cavity region 238.

The third polysilicon layer 236 may be doped in a manner similar to the first or second polysilicon layers. A sheet resistance of between 15–75 ohms per square is typical. In addition, a silicide may be formed on the third polysilicon layer as described earlier in reference to the first and second polysilicon layers, in order to achieve lower resistivity. The polysilicon anode is subsequently processed using photolithography techniques to form the structure shown in the layout illustrated in FIG. 1.

Figure 2N:
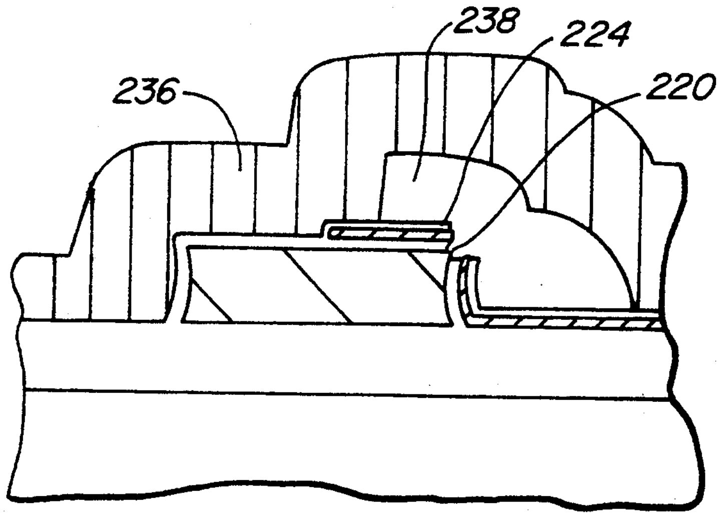
Figure 2O:
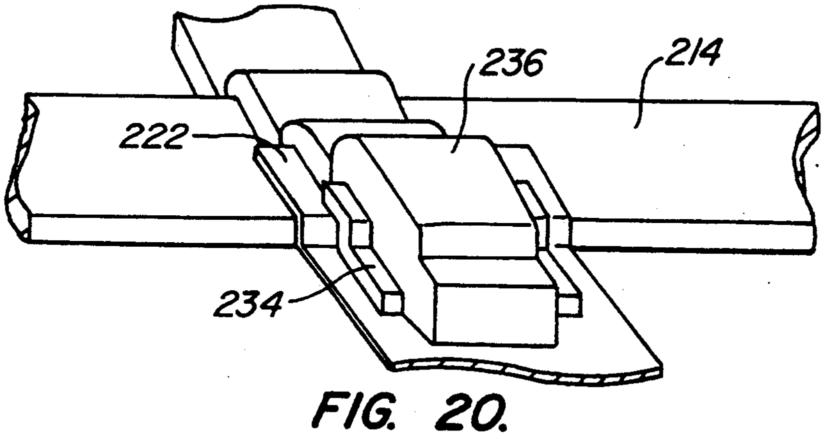
Figure 3:
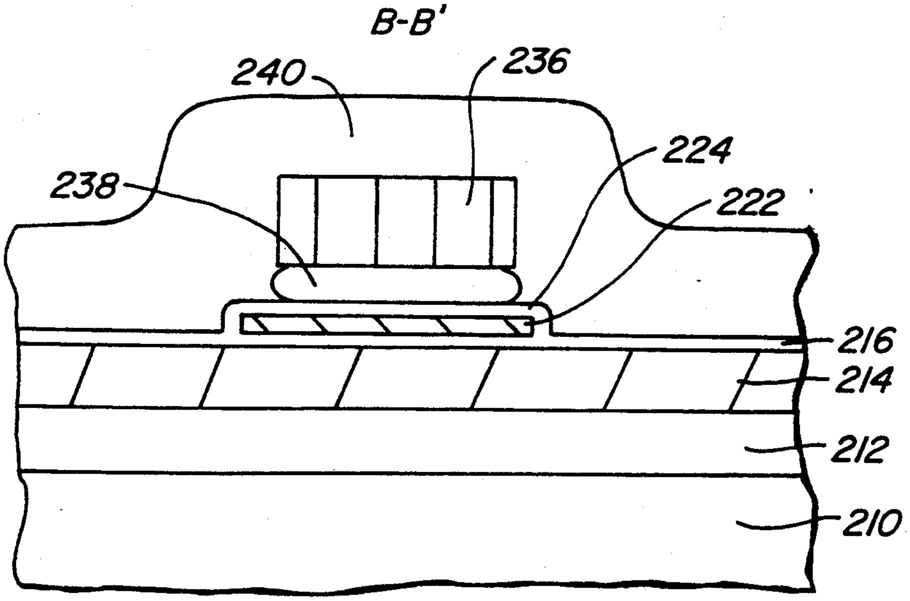
FIG. 3 is a cross-sectional view along the B—B' axis of the vacuum microelectronic device layout shown in FIG. 1.

FIG. 2O shows a perspective view of the cross-sectional view of the device seen in FIG. 2N. A cavity region 238 must be formed in order for electrons to flow from the emitter tip 220 to the anode 236. The cavity region 238 is typically formed by applying a dilute hydrofluoric acid or similar etchant from the sides and underneath the third polysilicon layer 236. FIG. 2O more clearly shows cavity formation during an undercutting etch around the sides and underneath the third polysilicon layer 236. The characteristics of the etch procedure must be chosen so that the thermal oxide layers 224 and 216 are not significantly etched away during the sacrificial oxide undercutting etch. Because the sacrificial oxide 234 is of relatively low density or is doped with a high impurity concentration, its relative etch rate compared to the oxide regions 224 and 216 is very high. Typically the sacrificial oxide will etch at a rate of 10 times that of the oxide in oxide layers 224 and 226.

After removal of the sacrificial oxide 234 a cavity region 238 which houses the active regions of the vacuum microtriode elements exists under the third polysilicon layer 236. After the cavity is formed, a layer of phosphosilicate glass 240, approximately 5000–20,000 Å thick is deposited by APCVD or LPCVD sealing the entire structure along the sides and the top. Prior to the LPCVD deposition, the pump down inside the deposition chamber (approximately 10–100 millitorr) creates an effective vacuum for triode operation prior to the sealing deposition. In the case for APCVD, when depositing at 300°–500° C., an effective partial vacuum is created in the triode cavity by virtue of Charles+ law. According to Charles+ law, the pressure of a gas in a cooling sealed chamber will drop in proportion to the change in absolute temperature. Because the emitter-anode spacing is on the order of 500 –10,0000 Å, the partial vacuum created when the sealed structure cools allows the mean free path of the electron to be greater than that of the spacing permitting efficient device operation.

Steps relating to contact, metallization, and passivation procedures are not discussed in detail. Standard techniques to accomplish these procedures are understood as to complete the structure of the microtriode vacuum device are well known to one skilled in the art.

It is understood that the above description and embodiments described herein are for illustrative purposes only. Many variations of the invention will become apparent to those of skill in the art upon review of this upon disclosure. Merely by way of an example, particular regions of the devices shown herein have been illustrated as being n-type, but it will become apparent to those of skill in the art that the dopant type may be reversed. Further, while the invention has been illustrated with regard to specific dopant concentrations in some instances, it should also be clear that a wide range of dopant concentrations may be used for many of the features of the devices herein without departing from the scope of the invention herein. In addition, different device structures may be replaced with their functional equivalents. For example, a polymer such as PMMA or similar compounds commonly used in semiconductor processing, may be used in substitution for the oxide layers.

Further, other microelectrode structures such as diodes, tetrodes and pentodes can be formed by modifying the aforementioned process. A diode device, comprised of an emitter and an anode structure, may be formed by eliminating the formation of the control grid and its corresponding insulating layer. Structures such as tetrodes and pentodes can be formed by simply repeating the formation of alternating polysilicon and insulating layers such that the desired multi-electrode structure is formed. In addition, although the aforementioned processes were described using polysilicon as a conductive medium, any conductive medium which has the capability of growing a high integrity insulating oxide, may be used in place of polysilicon. The scope of the invention should, therefore, be determined not with reference to the above description, but instead should be determined with reference to the appended claims along with their full scope of equivalents.

What is claimed is:

1. A method for fabricating a vacuum microelectronic device comprising the steps of:

forming a first conductive layer having an edge, said first conductive layer being capable of oxide growth;

oxidizing said first conductive layer to form a protrusion on said edge of said first conductive layer;

forming a first insulating layer on said first conductive layer;

forming a second conductive layer on said first insulating layer;

forming a second insulating layer on said second conductive layer;

forming an opening in said first insulating layer, said second conductive layer, said second insulating layer, and said first insulating layer to expose said protrusion;

forming a third insulating layer;

forming a third conductive layer; and selectively removing said third insulating layer to form a cavity region between said protrusion and said third conductive layer.

2. The method recited in claim 1 further comprising the step of evenly distributing dopants into said first, second and third conductive layer.

3. The method recited in claim 1 further comprising the step of depositing a metal layer to the surface of said conductive layer and applying heat to form silicide.

4. The method recited in claim 1 wherein distance between a said protrusion and said third conductive layer is dependent on the thickness of said sacrificial oxide.

5. The method as recited in claim 1 wherein said first conductive layer is formed on a substrate.

6. The method as recited in claim 1 wherein said opening in said second conductive layer is self aligned with said protrusion.

7. The method as recited in claim 1 wherein said third conductive layer is self aligned with said cavity region.

8. A method for fabricating a vacuum microelectronic device comprising the steps of:

forming a first conductive layer having an edge, said first conductive layer being capable of oxide growth;

oxidizing said first conductive layer to form a protrusion on said edge of said first conductive layer;

forming a first insulating layer on said first conductive layer;

forming a second conductive layer on said first insulating layer; and selectively removing said first insulating layer to form a cavity region between said protrusion and said second conductive layer.

9. The method recited in claim 8 further comprising the step of evenly distributing dopants into said first and second conductive layer.

10. The method recited in claim 8 further comprising the step of depositing a metal layer to the surface of said second conductive layer and applying heat to form silicide.

11. The method recited in claim 8 wherein distance between a said protrusion and said second conductive layer is dependent on the thickness of said first insulating layer.

12. The method as recited in claim 8 wherein said first conductive layer is formed on a substrate.

13. The method as recited in claim 8 wherein said second conductive layer is self aligned with said cavity region.

* * * * *